United States Patent [19]

Mizutani

[11] Patent Number: 4,878,199
[45] Date of Patent: Oct. 31, 1989

[54] SEMICONDUCTOR MEMORY DEVICE

[75] Inventor: Yoshihisa Mizutani, Tokyo, Japan

[73] Assignee: Kabushiki Kaisha Toshiba, Kawasaki, Japan

[21] Appl. No.: 150,052

[22] Filed: Jan. 29, 1988

[30] Foreign Application Priority Data

Feb. 27, 1987 [JP] Japan ................... 62-44509

[51] Int. Cl.⁴ .................. G11C 11/34; H01L 29/78
[52] U.S. Cl. .................. 365/185; 357/23.5; 357/41
[58] Field of Search .......... 365/182, 185; 357/23.5, 357/41

[56] References Cited

U.S. PATENT DOCUMENTS

| 4,417,325 | 11/1983 | Harari | 365/185 |
| 4,448,400 | 5/1984 | Harari | 365/185 |
| 4,612,629 | 9/1986 | Harari | 365/185 |
| 4,665,418 | 5/1987 | Mizutani | 357/23.5 |

FOREIGN PATENT DOCUMENTS 60-72275 4/1985 Japan .
60-72276 4/1985 Japan .

Primary Examiner—Joseph A. Popek
Attorney, Agent, or Firm—Oblon, Spivak, McClelland, Maier & Neustadt

[57] ABSTRACT

An electrically erasable-programmable read-only memory device has memory cells formed on a semiconductive substrate. Each memory cell has source and drain layers, and a floating gate electrode and a control gate electrode insulatively provided above the substrate. First and second well regions having a polarity opposite to that of the substrate are formed therein so that each well region contains one or a plurality of memory cells therein. When information stored in the memory cell or memory cells in the first well region is to be rewritten with new information in a partial data rewrite mode, a potential of the first well region is independently controlled so as to inhibit reading and writing of information in the memory cells in the first well region. A potential of the second well region is separately controlled so as to allow writing of the new information in the memory cells in the second well region. The new information is written in the memory cell or memory cells in the second well region. The written information can be subjected to a following normal data read operation. The memory cell or memory cells in the first well region become inactive thereafter.

16 Claims, 3 Drawing Sheets

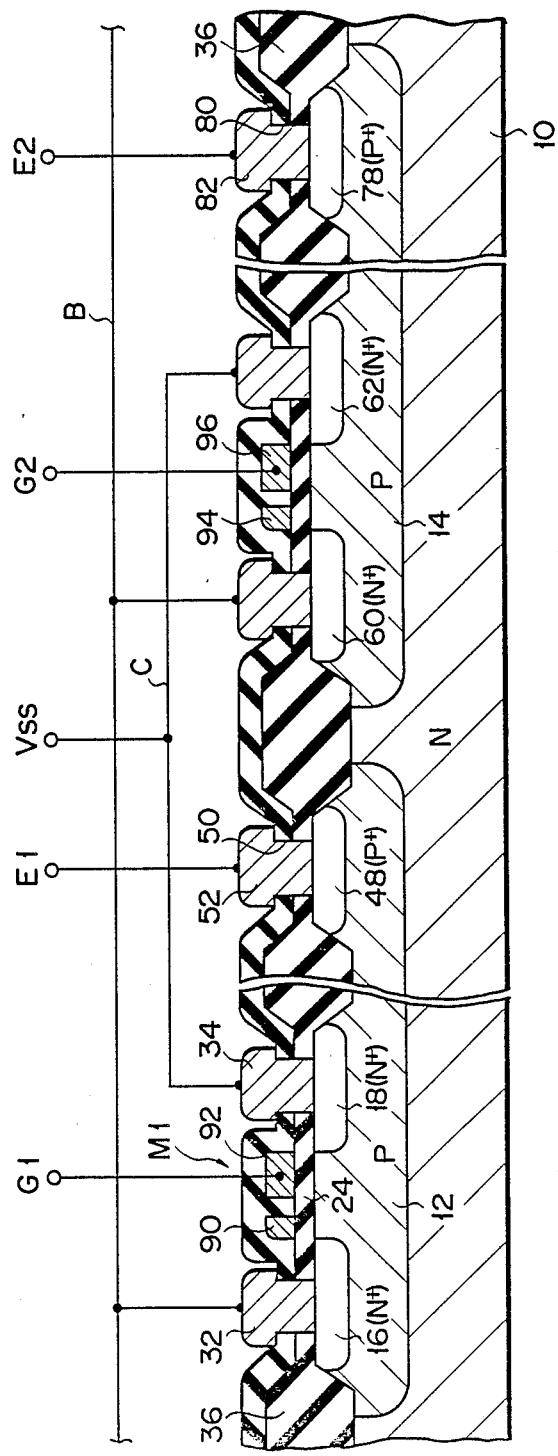
F I G. 3

SEMICONDUCTOR MEMORY DEVICE

BACKGROUND OF THE INVENTION

The present invention relates to a semiconductor memory device and, more particularly, to an erasable programmable read-only memory.

An erasable programmable read-only memory (to be referred to as an EPROM hereinafter in accordance with a custom among those skilled in the art) is currently a typical non-volatile semiconductor memory device in which information stored therein can be rewritten. It is well known that a "double-gate structure" is adopted in each memory cell of EPROMs. More specifically, a floating gate electrode and a control gate electrode are insulatively provided above a semiconductor chip substrate, on which semiconductor diffusion layers serving as source and drain layers are formed spaced apart from each other.

According to the EPROMs of this type, when a positive voltage (e.g., 20 volts) is applied to a drain layer and a control gate electrode of a selected memory cell in a write mode, carriers (e.g., electrons) flow from the source to the drain. A flow of the electrons generates impact ionization near the drain layer of the selected memory cell, and some of the electrons are injected into a floating gate and trapped therein. These electrons are stored or accumulated in the floating gate. In a read mode, a read bias voltage is applied to a control gate of the selected memory cell to detect whether a current flows through a transistor structure of the memory cell, thereby performing an information read operation. Stored information can be erased either by radiating ultraviolet rays onto the chip substrate of the EPROM or by electrically releasing the carriers stored in the floating gate of the memory cell of interest.

However, according to the conventional EPROMs, an operation of partially erasing stored information is cumbersome and relatively time-consuming. For example, when ultraviolet rays are radiated to erase stored information of a desired memory cell, stored contents of all the memory cells are erased at the same time. Therefore, the same information must be rewritten in the memory cells other than the memory cell (or memory cells) to be erased. Although stored information of only a desired memory cell (or memory cells) can be electrically erased (this is known as an "electrically erasable-programmable read-only memory" or "E²PROM"), an additional circuit for electrically erasing information is complicated in arrangement. Especially when the EPROMs are formed integrally with each other on a chip substrate of a high-speed logic LSI, the above problems become more serious in terms of a speed of accessing management of a memory unit. Assume that information of the memory unit must be rewritten during an operation of a logic circuit section. In this case, if the operation of the logic circuit section is interrupted each time the information is rewritten, a high-speed operation of the LSI cannot be expected at all.

SUMMARY OF THE INVENTION

It is, therefore, an object of the present invention to provide a new and improved non-volatile semiconductor memory device which can effectively, partially rewrite information stored in its memory cells.

In accordance with the above object, the present invention is addressed to a specific non-volatile semiconductor memory device which has memory cells formed on a semiconductive substrate. Each memory cell has source and drain layers diffused in the substrate and floating gate and control gate electrodes insulatively provided above the substrate. A plurality of well regions including first and second well regions are formed on a surface portion of the substrate so that each well region contains one or a plurality of memory cells. These well regions have a conductivity type opposite to that of the substrate.

When old information stored in a memory cell (or memory cells) of the first well region is to be rewritten with new information in a partial data rewrite mode of the memory device, stored information of the memory cells in the first well region are rewritten as follows without partially erasing data of the memory device. That is, the potential of the first well region is controlled to inhibit read/write of information in the memory cells of the first well region. At this time, the potential of the second well region is separately controlled to allow writing of the new information in memory cells of the second well region. Therefore, the new information is written in the memory cells of the second well region. This written information can be subjected to a following normal data read operation. The memory cells of the first well region become inactive thereafter. In other words, the memory cells in the second well region serve as an auxiliary memory section of the memory cells in the first well region. As a result, the above object of the present invention can be achieved.

The present invention and its objects and advantages will become more apparent in a detailed description of preferred embodiments to be presented below.

BRIEF DESCRIPTION OF THE DRAWINGS

In the detailed description of preferred embodiments of the invention presented below, reference is made to the accompanying drawings in which:

FIG. 3 is a diagram schematically showing a sectional arrangement of main part of an EPROM according to a third embodiment of the present invention.

DETAILED DESCRIPTION OF THE PREFERRED EMBODIMENTS

Figure 1:
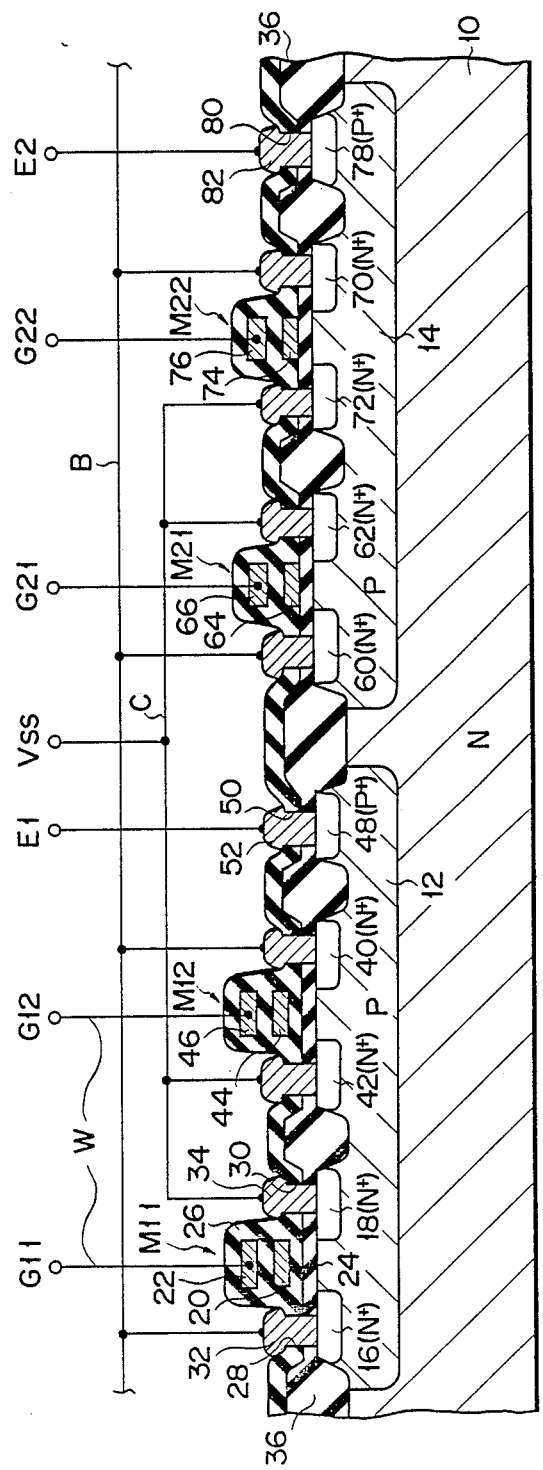
FIG. 1 is a diagram schematically showing a sectional arrangement of main part of an EPROM according to a first embodiment of the present invention.

Referring now to FIG. 1, an erasable programmable read-only memory (to be referred to as an "EPROM" hereinafter) has silicon substrate 10 of n-type conductivity. A plurality of well regions of p-type conductivity are formed in substrate 10. Note that in a sectional view of main part of the EPROM shown in FIG. 1, only two well regions 12 and 14 are visible. Memory cells M11, M12, ... are formed on region 12; and memory cells M21, M22, ... are formed on region 14. Each memory cell has a "double-gate structure". For the sake of illustrative simplicity, only four memory cells (M11, M12, M21, and M22) are shown in FIG. 1. However, as is well known, the EPROM includes other memory cells (now shown) having the same structure as that shown in FIG. 1 and arranged in a matrix manner on substrate 10.

Memory cell M11 has two heavily-doped semiconductor diffusion layers 16 and 18 of n-(n⁺-) type conductivity formed spaced apart from each other in region 12. Layers 16 and 18 serve as a drain and a source of memory cell M11, respectively. Conductive layers 20 and 22 serving as a floating gate electrode and a control gate electrode respectively, are insulatively provided above a substrate region (which serves as a channel) sandwiched between layers 16 and 18. Floating gate 20 is electrically insulated in memory cell M11; and control gate 22 is connected to control terminal G11. According to this embodiment, control gate 22 is stacked above floating gate 20. Insulating layers 24 and 26 are deposited on substrate 10 so as to cover gates 20 and 22. Layers 24 and 26 have contact holes 28 and 30 at positions of drain 16 and source 18, respectively. Metal layers 32 and 34 are provided in holes 28 and 30, and are used as source electrode S and drain electrode D, respectively. Field insulating layer 36 is deposited on the surface of substrate 10 at which well region 12 is formed so as to define cell regions corresponding to memory cells M.

Memory cell M12 formed on same well region 12 is arranged similarly to memory cell M11: memory cell M12 includes diffusion layers 40 and 42 of n+-type conductivity serving as a drain and a source, respectively, floating gate 44, and control gate 46 connected to control gate terminal G12.

Heavily-doped diffusion layer 48 of p-type conductivity is formed as a third diffusion layer on another surface region of well region 122. Insulating layers 24 and 26 have contact hole 50 for layer 48, and metal layer 52 is formed in hole 50. As is clearly shown in FIG. 1, layer 52 is connected to region 12 through third diffusion layer 48 and hence serves as well-potential control electrode El for independently controlling a potential of region 12.

Memory cells M21 and M22 formed on well region 14 are arranged similarly to memory cells M11 and M12: memory cell M21 includes diffusion layers 60 and 62 of n+-type conductivity serving as a drain and a source, respectively, floating gate 64, and control gate 66 connected to control gate terminal G21, while memory cell M22 includes diffusion layers 70 and 72 of n+-type conductivity serving as a drain and a source, respectively, floating gate 74, and control gate 76 connected to control gate terminal G22.

Heavily-doped diffusion layer 78 of p-type conductivity is formed on another surface portion of well region 14. Layer 78 is in contact with metal layer 82 formed in contact hole 80. Metal layer 82 is connected to well region 14 through diffusion layer 78 and hence serves as well-potential control electrode E2 for independently controlling a potential of well region 14.

Memory cells M11 and M12 formed on well region 12 and memory cells M21 and M22 formed on well region 14 are arranged to form, e.g., an array. Under this condition, as shown in FIG. 1, one bit line B of parallel bit lines may be connected in common to drain diffusion layers 16, 40, 60, and 70 of memory cells M11, M12, . . . and M21, M22, . . . Source diffusion layers 18, 42, 62, and 72 of memory cells M11, M12, M21, and M22 are connected to common wiring line C to which a constant voltage (e.g., ground voltage Vss) is applied. At this time, control gates 22, 46, 66, and 76 of memory cells M11, M12, M21, and M22 serve as word lines W, respectively. Well-potential control electrodes 52 and 82 of regions 12 and 14 are connected to external terminals E1 and E2, respectively. Therefore, potentials of well regions 12 and 14 can be separately controlled by properly applying different bias voltages to terminals E1 and E2.

According to the EPROM having the above arrangement, when data read or write is to be performed with respect to a desired memory cell (e.g., M11), control electrode 52 including memory cell M11 is applied with the same voltage as a voltage (source voltage) Vss applied to source electrode 32, and word and bit lines connected to memory cell M11 are designated, thereby performing a normal write or read operation.

An operation of partially rewriting information stored in the above EPROM will be described in detail below. For example, assume that numerical data or information of a soft program for defining an operation sequence for a logic LSI (not shown) interlocked with the EPROM is stored in memory cells M11, M12, . . . in well region 12; and no information is stored in memory cells M21, M22, . . . in well region 14. In other words, memory cells M21, M22, . . . are provided as auxiliary memory cells for memory cells M11, M12, . . .

During data processing of the logic LSI, when information stored in one set of memory cells M11, M12, . . . is to be rewritten, a voltage different from source voltage Vss is applied as a bias voltage to well-potential control electrode 52 of well region 12 which includes selected memory cells M11, M12, . . . , thereby arbitrarily setting a potential of well region 12. For example, when a negative bias voltage is applied to electrode 52, the potential of region 12 of selected memory cells M11, M12, . . . is reduced accordingly. Therefore, an effective threshold voltage viewed from control gate 22 (or 46) of each memory cell is increased. As a result, memory cells M11, M12, . . . are set in a read inhibit state. This is because when the threshold voltage of memory cells M11, M12, . . . is properly increased, a current (called an "ON current") is prevented from flowing between drains 16 and 40 and sources 18 and 42 of memory cells M11, M12, . . . regardless of whether data stored in floating gates 20 and 44 of the memory cells has a logic "0" level or a logic "1" level even if a normal read voltage is applied to control gates 22 and 46. It should be noted that when a negative control voltage (bias voltage) is applied to electrode 52, the ON current flowing through memory cells M11, M12, . . . is reduced by applying a normal write voltage. Therefore, data write with respect to memory cells M11, M12, . . . is simultaneously inhibited.

New information to replace the stored contents of the first set of memory cells M11, M12, . . . is written in the second set of memory cells M21, M22, . . . while setting the first set of memory cells M11, M12, . . . which initially store information in a data read/write inhibit state. At this time, by applying voltage Vss to well-potential control electrode 82 of well region 14 and designating corresponding word lines (in this case, control gates G21, G22, . . . ) and bit line B, the new information can be written in the second set of memory cells M21, M22, . . .

Although bit line B of the second set of memory cells M21, M22, . . . is also connected to the first set of memory cells M11, M12, . . . (which hold the old stored contents), the new information is not written in the first set of memory cells M11, M12, . . . even if bit line B is designated to write the new information in the second set of memory cells M21, M22, . . . This is because, as described above, the first set of memory cells M11, M12, . . . is forcibly set in the read/write inhibit state by applying a negative voltage to well region 14 so that the potential of region 14 becomes negative.

Information stored in the EPROM can be entirely erased by, if desired, radiating ultraviolet rays onto substrate 10, i.e., by an optical method as in the conventional manner. Therefore, when the stored contents of the first and second sets of memory cells M11, M12, M21, M22, . . . are to be erased at the same time, these memory cells may be subjected to ultraviolet ray radiation.

According to the first embodiment of the present invention, stored contents of the EPROM can be partially rewritten at a high speed. According to this embodiment, when stored information of the EPROM is to be partially rewritten, the stored information need not be partially erased. In order to partially rewrite the stored contents of the EPROM, one set of memory cells (e.g., M11, M12, . . . ) which store old information are set in a read/write inhibit state by controlling a potential of a well region (e.g., well region 12) which includes the memory cells. As a result, new information can be rewritten in another set of memory cells (e.g., M21, M22, . . . ) using a normal writing technique. Therefore, the stored contents of the EPROM can be partially written at a high speed. One set of memory cells which store the old information can be easily set in the read/write inhibit state by applying a negative bias voltage to well-potential control electrode E1 of well region 12 which includes the memory cells. At this time, no special control operation is required for row and column decoder circuits of the EPROM. Since this fact contributes to prevent an arrangement of the peripheral circuit portion of the EPROM from being complicated, a reduction in integration density of the EPROM can be prevented.

Figure 2:
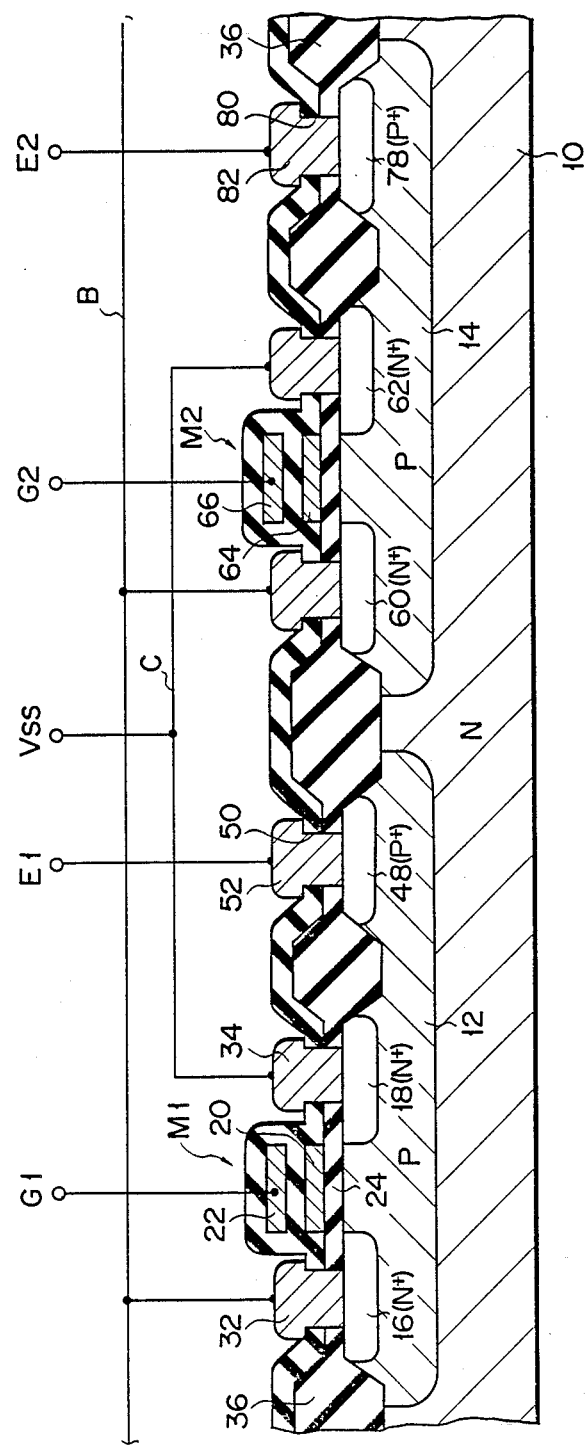
FIG. 2 is a diagram schematically showing a sectional arrangement of main part of an EPROM according to a second embodiment of the present invention.

FIG. 2 shows an EPROM according to a second embodiment of the present invention. This EPROM is characterized in that single memory cell M is provided in well region 12 or 14. The other arrangement is the same as that of the above first embodiment. In a sectional view of FIG. 2, the same parts as in the sectional arrangement of the EPROM of FIG. 1 are denoted by the same reference numerals, and a detailed description thereof will be omitted.

By providing a well region in each memory cell M, the aforementioned partial information rewriting ability of EPROM can be enhanced such that information of the EPROM can be partially rewritten in units of binary bit data. In other words, information stored in the EPROM is not partially erased but effectively partially rewritten in units of bits. This embodiment can be suitably adopted to a case wherein a capacity of a memory unit which is associated with a logic LSI (not shown) is relatively small. This is because information can be updated in units of small amounts in the arrangement of the second embodiment.

Although the invention has been described with reference to a specific embodiment, it shall be understood by those skilled in the art that numerous modifications may be made that are within the spirit and scope of the inventive contribution.

For example, the "double-gate structure" applied in each memory cell M of the EPROM need not be limited to a stacking type which is adopted in the above embodiments. Regardless of whether a single memory cell M or a plurality of memory cells M are provided in region 12, each memory cell M may be deformed to have a "side wall floating gate double-gate structure" as shown in FIG. 3. More specifically, as shown in FIG. 3, a floating gate electrode and a control gate electrode of each memory cell M are formed in alignment with each other above a source and a drain provided in a well region formed in substrate 10. For example, according to memory cell M1, floating gate 90 and control gate 92 are formed in alignment with each other on gate insulating layer 24 deposited on substrate 10. Widths of gates 90 and 92 are substantially self-aligned with source 16 and drain 18 of memory cell M1, respectively. The other arrangement is similar to those of the above embodiments. Floating gate 94 and control gate 96 of a memory cell formed on well region 14 are insulatively provided in alignment with each other above substrate 10 in the same manner as described above. In this embodiment, the effect of the present invention described above can also be obtained.

In all the above embodiments, a substrate of p-type conductivity is used. However, a substrate of n-type conductivity may be used. In this case, when memory accessing is to be executed, the polarities of voltages applied to bit line B, word lines W, and common wiring line C may be set oppositely in the present invention described above.

What is claimed is:

1. A non-volatile semiconductor memory device comprising:
    (a) a semiconductor substrate of a first conductivity type having a surface portion;
    (b) memory cells formed in the surface portion of said substrate, said memory cells being divided into a certain number of cell groups, each of said memory cells comprising,
    first and second semiconductor layers having the first conductivity type serving as a source and a drain of said memory cell, respectively, and
    first and second conductive layers insulatively provided above said substrate and serving as a floating gate electrode and a control gate electrode of said memory cell, respectively;
    (c) semiconductors well regions of a second conductivity type formed in the surface portion of said substrate to surround said cell groups respectively;
    (d) well-potential controller means for applying, when a specific cell group is selected from among said memory cell groups, to said well regions of the remaining cell groups a bias voltage which changes a threshold level of said memory cell to prevent a flow of an ON current between said source and said drain, thereby inhibiting reading and writing of information in the memory cells of said remaining cell groups.

2. The device according to claim 1, wherein said well-potential controller means supplies the well region of said specific cell group with a voltage having the same polarity as that of the voltage applied to one of said source and said drain of said memory cells included in said specific cell group.

3. The device according to claim 2, wherein said well-potential controller means comprises:
    a heavily-doped diffusion layer of the second conductivity type formed in a corresponding one of said well regions; and
    a third conductive layer electrically connected to said diffusion layer and serving as a well-potential control electrode.

4. The device according to claim 3, wherein, in a partial information rewrite mode of said device, said third conductive layer applies to a corresponding well region of said remaining cell groups a voltage having a polarity opposite to that of the voltage applied to said source of said memory cell.

5. The device according to claim 4, wherein said first and second conductive layers are stacked together above said substrate.

6. The device according to claim 4, wherein said first and second conductive layers are arranged in alignment with each other above said substrate.

7. The device according to claim 4, wherein a single memory cell is formed in each of said well regions.

8. The device according to claim 4, wherein a plurality of memory cells are formed in each of said well regions.

9. The device according to claim 8, wherein said well-potential controller means applies, in the partial information rewrite mode, the bias voltage to said remaining well regions, thereby inhibiting reading and writing of information in said memory cells in said remaining well regions.

10. An erasable programmable read-only memory device in which information can be erased by radiating ultraviolet rays, comprising:
   (a) a semiconductive substrate of a first conductivity type;
   (b) first and second semiconductive well regions of a second conductivity type formed in said substrate;
   (c) memory cells formed in said first and second well regions, each of said memory cells comprising a metal-insulator-semiconductor field effect transistor which has,
   first and second semiconductor layers having the first conductivity type and respectively serving as a source and a drain of said transistor, and
   first and second gate electrodes insulatively provided above said substrate and serving as a floating gate electrode and a control gate electrode of said memory cell; and
   (d) well-potential controller means, electrically connected to said first and second well regions, for independently controlling, when information stored in said memory cell in said first well region is to be rewritten, a potential of said first well region so as to inhibit reading and writing of the information in said memory cell in said first well region, and for separately controlling a potential of said second well region so as to allow writing of new information in said memory cell in said second well region, whereby said memory cell in said second well region becomes active in place of said memory cell in said first well region and stores the new information, which can be subjected to a following data read operation, and said memory cell in said first well region becomes inactive thereafter, so that the stored information of said memory cell in said first well region can be effectively rewritten without partially erasing data of said memory device.

11. The device according to claim 10, wherein, when information stored in said memory cell in said first well region is to be rewritten, said well-potential controller means applies to said first well region a bias voltage which changes a threshold level of said memory cell in said first well region and prevent a flow of an ON current between said source and said drain, thereby inhibiting reading and writing of information of said memory cell in said first well region, said well-potential controller means setting a potential of said second well region substantially at the same level as that of a potential of one of said source and drain of said memory cell formed in said second well region, thereby allowing writing of new information in said memory cell in said second well region.

12. The device according to claim 11, wherein said well-potential controller means comprises:
   first and second heavily-doped semiconductor diffusion layers having the second conductivity type formed in said first and second well regions, respectively.

13. The device according to claim 12, wherein each of said first and second semiconductive well regions has a plurality of memory cells.

14. The device according to claim 13, wherein said well-potential controller means applies, when information stored in said memory cells in said first well region is to be rewritten, the bias voltage to said first well region, thereby inhibiting reading and writing of information in said memory cells in said first well region.

15. The device according to claim 14, wherein said floating gate and said control gate are stacked together above said substrate.

16. The device according to claim 14, wherein said floating gate and said control gate are arranged in alignment with each other above said substrate.

* * * * *